United States Patent
Weng et al.

(10) Patent No.: US 7,687,446 B2
(45) Date of Patent: Mar. 30, 2010

(54) METHOD OF REMOVING RESIDUE LEFT AFTER PLASMA PROCESS

(75) Inventors: Cheng-Ming Weng, Hsinchu County (TW); Miao-Chun Lin, Tainan County (TW); Mei-Chi Wang, Tainan County (TW); Jiunn-Hsiung Liao, Tainan County (TW); Wei-Cheng Yang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 1066 days.

(21) Appl. No.: 11/307,394

(22) Filed: Feb. 6, 2006

(65) Prior Publication Data

US 2007/0184996 A1   Aug. 9, 2007

(51) Int. Cl.
*H01L 21/02* (2006.01)
(52) U.S. Cl. .................. 510/175; 134/1.3; 252/79.3
(58) Field of Classification Search .......... 510/175; 134/1.3; 252/79.3
See application file for complete search history.

(56) References Cited

U.S. PATENT DOCUMENTS

| 6,605,230 B1 | 8/2003 | Liaw et al. ............ 216/104 |
| 6,828,228 B2 * | 12/2004 | Li ..................... 438/637 |
| 6,864,183 B2 * | 3/2005 | Maekawa ............. 438/710 |
| 6,893,578 B1 | 5/2005 | Clews et al. ............ 216/99 |
| 2003/0203606 A1 * | 10/2003 | Maekawa ............. 435/592 |

FOREIGN PATENT DOCUMENTS

CN   1202274   12/1998

* cited by examiner

*Primary Examiner*—Gregory E Webb
(74) *Attorney, Agent, or Firm*—Jianq Chyun IP Office

(57) ABSTRACT

A method of removing the residue left after a plasma process is described. First, a substrate having at least a material layer thereon is provided. The material layer includes a metal. Then, a fluorine-containing plasma process is performed so that a residue containing the aforesaid metallic material is formed on the surface of the material layer. After that, a wet cleaning operation is performed using a cleaning agent to remove the residue. The cleaning agent is a solution containing water, a diluted hydrofluoric acid and an acid solution.

14 Claims, 3 Drawing Sheets

METHOD OF REMOVING RESIDUE LEFT AFTER PLASMA PROCESS

BACKGROUND OF THE INVENTION

1. Field of the Invention

The present invention relates to a semiconductor fabricating process. More particularly, the present invention relates to a cleaning agent and a method of removing residue after a plasma process using the cleaning agent.

2. Description of the Related Art

Due to the rapid development of integrated circuit technology, device miniaturization and integration is an inevitable trend and an important research topic in the manufacturing industry. Among the technology, dry etching technique, capable of providing an anisotropic etching process, has become one of the indispensable techniques in fabricating integrated circuits.

In the plasma etching method of a dry etching operation, plasma is used to dissociate reactive gas molecules into reactive ions capable of reacting with film material. Then, through the chemical reaction between the ions and the film layer, the thin film material exposed to the ions is transformed into a volatile substance and subsequently pumped away by a vacuum system to provide the etching process.

However, the reactive gases passing into a reaction chamber for the dry etching process may also undergo a polymerization reaction. The organic polymer formed as a result of the polymerization is deposited on the surface of the device to adversely affect a subsequent etching process. Moreover, the reactive gases used for etching the dielectric layer are mostly fluorine-containing gases. These fluorine-containing gases will react with the titanium nitride hard mask to produce titanium fluoride ($TiF_x$) on the surface of the device, and ultimately, leading to a profile change of the device, abnormal conductivity, leakage or short-circuiting between film layers and a reduced reliability of the device.

In the fabrication of metallic interconnects, for example, the process of forming the conductive line and plug opening (a dual damascene opening) can easily produce the aforesaid polymer and titanium fluoride residues. The effect produced by these residues is particularly significant in the deep submicro fabrication process.

Although solvent such as ST250 can be used to improve the 'residue' problem, the solvent often contains expensive and dated ammonium-base compounds such as emulsifiers, restrainers and buffers. Moreover, this type of solvent can hardly remove metallic fluoride compound and the fluorine-containing particles must be removed within a designated period of time to prevent the formation of metallic fluorides. Furthermore, the type of solvent such as the ST250 will etch the metallic conductive lines and affect the conductivity of the device. Even after repeated rinsing, a portion of the organic polymer residues will still be left leading to a change of the device profile and a drop in product yield. Otherwise, a dry cleaning operation and another wet cleaning operation are required after applying the ST250 cleaning solvent. Hence, the conventional method not only is complicated but also produces additional problems. Consequently, an effective means of removing the residues left after performing a plasma manufacturing process is desired in the manufacturing industry.

SUMMARY OF THE INVENTION

Accordingly, at least one objective of the present invention is to provide a cleaning agent and an effective method of removing the residues left after a plasma process so that the chance of producing a device having abnormal conductivity or a current leak/short circuit is lowered. Ultimately, the product yield can be increased.

At least another objective of the present invention is to provide a cleaning agent and a method of removing the residues left after performing a plasma process capable of reducing the production cost and maintaining a constant external profile so that the subsequent fabrication process is facilitated.

To achieve these and other advantages and in accordance with the purpose of the invention, as embodied and broadly described herein, the invention provides a cleaning agent suitable for removing a compound containing titanium fluoride. The cleaning agent is a solution mixture containing an acid solution, a diluted hydrofluoric acid and some water. The percentage by weight of the acid solution in the cleaning agent is greater than or equal to 1% and the concentration of the diluted hydrofluoric acid solution is greater than or equal to 30 ppm, for example.

According to the cleaning agent in one embodiment of the present invention, the aforementioned acid solution includes an organic acid compound or an inorganic acid compound. The inorganic acid compound includes sulfuric acid, hydrochloric acid, phosphoric acid or nitric acid, for example.

According to the cleaning agent in one embodiment of the present invention, the percentage by weight of the aforementioned acid solution is greater than or equal to 5% and the concentration of diluted hydrofluoric acid is greater than 150 ppm.

The present invention also provides a method of removing the residues left after performing a plasma process. First, a substrate having at least a material layer thereon is provided. The material layer includes a metallic material. Then, a fluorine-containing plasma process is performed so that a residue containing the aforesaid metallic material is formed on the surface of the material layer. After that, a wet cleaning operation is performed using a cleaning agent to remove the residue. The cleaning agent is a solution containing water, a diluted hydrofluoric acid and another acid solution.

According to the method of removing the residues after performing a fluorine-containing plasma process in one embodiment of the present invention, the concentration of the diluted hydrofluoric acid is greater than or equal to 30 ppm. The percentage by weight of the acid solution in the cleaning agent is greater than or equal to 1%, and the acid solution includes an organic acid compound or an inorganic acid compound.

According to the method of removing the residues after performing a fluorine-containing plasma process in one embodiment of the present invention, the aforesaid metallic material is titanium or tantalum, for example. The aforesaid residual compound is titanium fluoride or tantalum fluoride, for example. The aforesaid material layer is fabricated using titanium, titanium nitride, tantalum nitride or titanium tungsten alloy, for example.

According to the method of removing the residues after performing a fluorine-containing plasma process in one embodiment of the present invention, the aforesaid substrate further includes a conductive area and a low-k dielectric layer disposed from bottom to top between the material layer and the substrate.

According to the method of removing the residues after performing a fluorine-containing plasma process in one embodiment of the present invention, the low-k dielectric layer is fabricated using potassium fluoride, fluorinated amorphous carbon or carbon-doped oxide, for example.

According to the method of removing the residues after performing a fluorine-containing plasma process in one embodiment of the present invention, the method further includes performing the fluoride-containing plasma process using the material layer as a mask to form an opening that exposes the conductive area in the low dielectric material layer.

According to the method of removing the residues after performing a fluorine-containing plasma process in one embodiment of the present invention, the aforesaid opening is a via hole, a contact hole or a dual damascene opening, for example.

According to the method of removing the residues after performing a fluorine-containing plasma process in one embodiment of the present invention, after performing the fluoride-containing plasma process but before performing the wet cleaning operation, the method further includes performing a dry cleaning operation.

According to the method of removing the residues after performing a fluorine-containing plasma manufacturing process in one embodiment of the present invention, the plasma gases used in the dry cleaning operation includes hydrogen and nitrogen or hydrogen and helium, for example.

According to the method of removing the residues after performing a fluorine-containing plasma process in one embodiment of the present invention, the method further includes a conductive area disposed between the substrate and the material layer, and a low-k dielectric layer disposed on the material layer and covers the substrate, for example.

According to the method of removing the residues after performing a fluorine-containing plasma process in one embodiment of the present invention, the method further includes performing the fluorine-containing plasma process using the material layer as an anti-reflection layer to form an opening to expose the material layer in the low dielectric material layer.

In the present invention, a cleaning agent is used to remove the residual compound produced after a fluorine-containing plasma process. Hence, the metallic fluoride compound produced by the plasma process can be efficiently removed so that the probability of the device having abnormal conductivity, current leaks or short circuit is significantly reduced and the product yield is improved. Furthermore, the organic polymer formed in the plasma process can also be removed through the dry cleaning operation. Thus, not only is the production cost of the device reduced, but the external profile of the device is also maintained to facilitate a subsequent fabrication process and increase the yield and reliability of the product.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
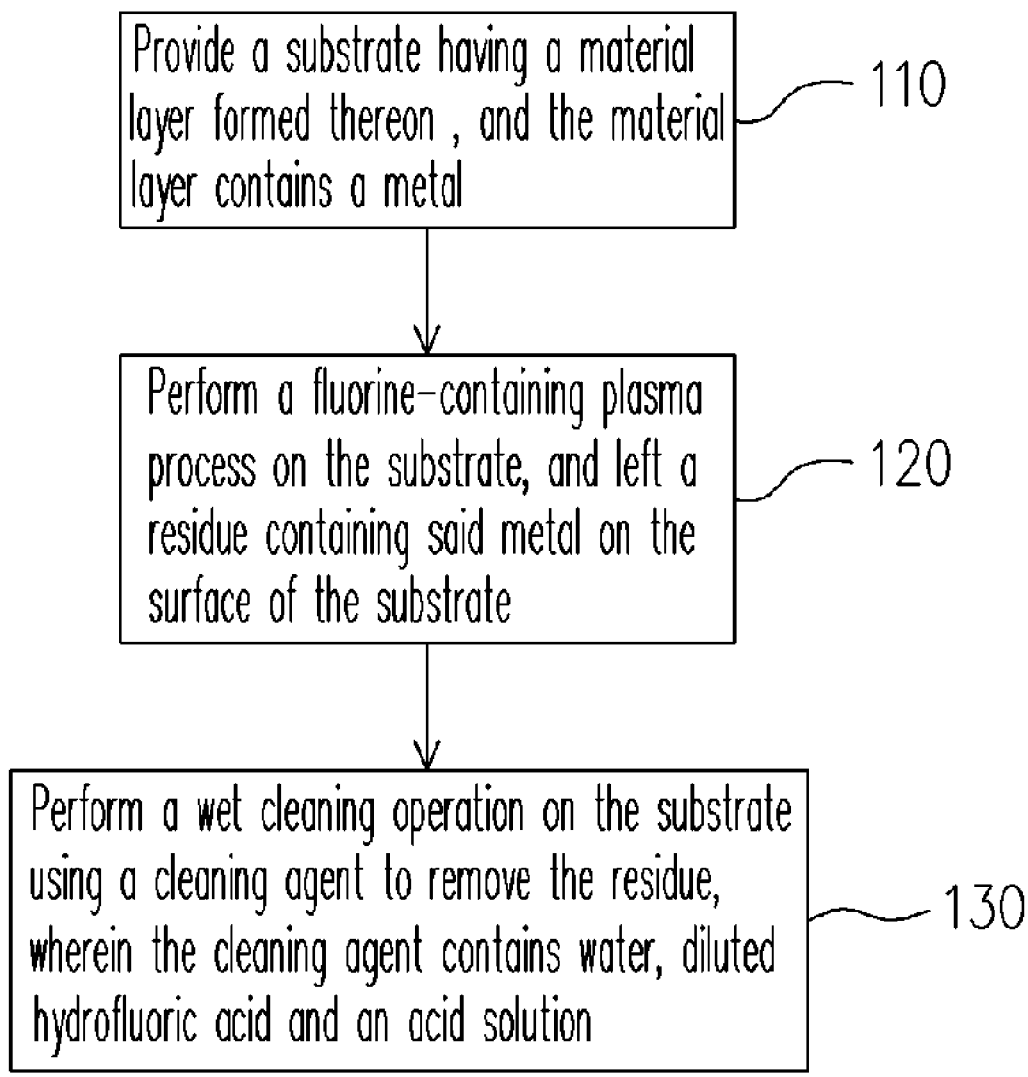
FIG. 1 is a flow diagram showing the steps for removing the residues deposited after a plasma process according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a cleaning agent for removing residues that contain titanium fluoride. The cleaning agent is a mixture comprising water, diluted hydrofluoric acid and an acid solution. The wafer can be de-ionized water or ultrapure water. The diluted hydrofluoric acid has a concentration greater than or equal to 30 ppm such as 150 ppm. The acid solution is an inorganic acid compound or an organic acid compound, for example. The inorganic acid compound includes sulfuric acid, phosphoric acid, nitric acid and hydrochloric acid, for example. The acid solution has a percentage by weight concentration of greater than or equal to 1%, for example. The cleaning agent is capable of removing residues containing titanium fluoride, tantalum fluoride and organic polymer compound, for example.

In one embodiment, the ingredients and the ratio of compounds constituting the cleaning agent includes, for example, a diluted hydrofluoric acid at a concentration of 800 ppm and a sulfuric acid at a concentration greater than or equal to 5%. Obviously, the higher the concentration of the hydrofluoric acid and the acid solution, the more effectiveness the process of removing the metallic fluoride compound and organic polymer compound will be and the faster removal rate.

The cleaning agent comprises diluted hydrofluoric acid and an acid solution, hence, the cleaning agent is able to remove metallic fluoride compound such as titanium fluoride or tantalum fluoride so that the pattern on the substrate can return to its original profile to prevent possible short circuit or current leak.

In the following, the method of removing the residues left after performing a plasma process is described. FIG. 1 is a flow diagram showing the steps for removing the residues deposited after a plasma process according to one embodiment of the present invention.

As shown in FIG. 1, the method of removing the residues after a plasma process according to the present invention includes providing a substrate having a material layer thereon (in step 100). The material layer includes a metal, for example. Here, the substrate is a chip having at least a device such as a metal-oxide-semiconductor (MOS) transistor including NMOS, PMOS or CMOS or a logic device such as ROM, DRAM or SRAM. Obviously, metallic interconnects might be formed on the device. The material layer is disposed on the surface of the substrate, for example. The material layer is fabricated using a metal or a metal-containing compound, such as titanium, titanium nitride, tantalum nitride or tungsten-titanium alloy. In other words, the metal within the material layer includes titanium or tantalum. The material layer serves as a hard mask layer or an anti-reflection layer, for example.

Then, a fluoride-containing plasma process is performed on the substrate to form the aforesaid metallic residues on the surface of the substrate (in step 120). The fluoride-containing plasma process is performed to etch the substrate. Furthermore, the fluoride-containing gases used for generating the plasma in the fluoride-containing plasma process include $CF_4$, $C_2F_6$, $C_3F_8$, $C_4F_8$, $C_5F_8$ or $CFH_3$, for example. These fluoride atoms may react with the metal in the material layer to produce metallic fluoride compounds deposited on the surface of the substrate as residues. These residues include titanium fluoride or tantalum fluoride compound, for example. In the titanium fluoride ($TiF_x$) compound, the ratio between the fluorine and titanium differs according to the amount of reactions between the fluoride and the titanium metal. Typically, the value of x is between 1~4 ($1 \leq x \leq 4$). With the passage of time, the formation of titanium fluoride or tantalum fluoride has increasingly significant consequences. The residues not only affect the profile of the device, but also lead to possible short circuit or current leak in the device.

Thereafter, a wet etching operation is performed on the substrate using a cleaning agent to remove the residues (in step 130). The cleaning agent is a solution mixture containing water, dilute hydrofluoric acid and an acid solution. Since the ingredients and ratios are similar to the first embodiment, a detailed description is not repeated here. In one embodiment, the wet cleaning operation is carried out at room temperature and the cleaning agent includes diluted hydrofluoric acid at a concentration of 800 ppm, sulfuric acid at a percentage concentration by weight of greater than or equal to 5% and de-ionized water, for example.

Due to the presence of diluted hydrofluoric acid and an acid solution in the cleaning agent, the cleaning agent is able to dissolve metal fluoride residues so that the pattern on the substrate can return to its original profile to prevent possible short circuit or current leak. Thus, even if metal fluoride compounds are produced in the fabricating process, it can be easily removed without removing the fluoride particles by some means within a designated period (before the metal fluoride compounds are formed). Therefore, in an automated mass production process, the present method can maintain the external produce of chips and prevent large profile variations due to the etching time.

Figure 2:
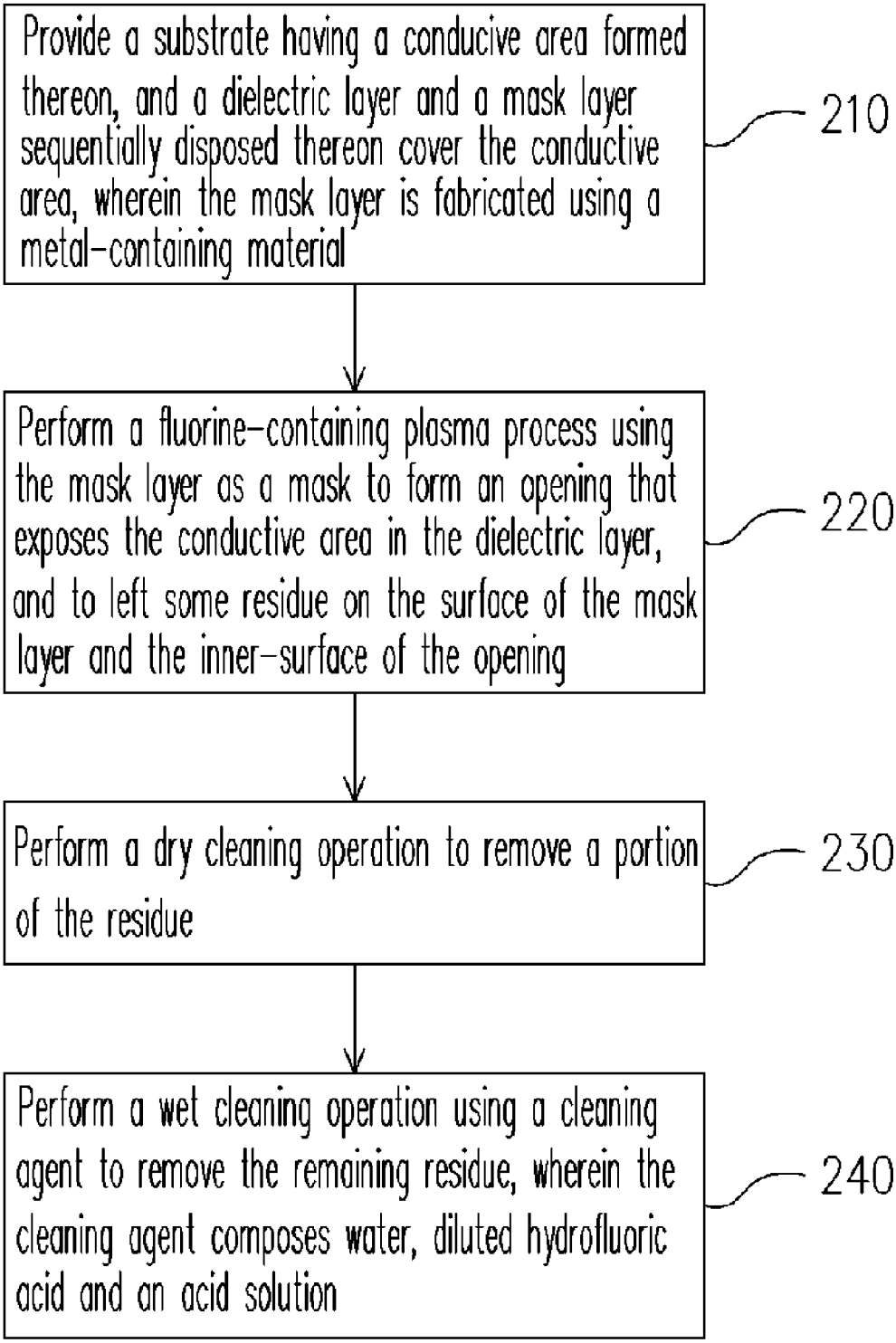
FIG. 2 is a flow diagram showing the steps for removing the residues deposited after a plasma process according to another embodiment of the present invention.
Figure 3:
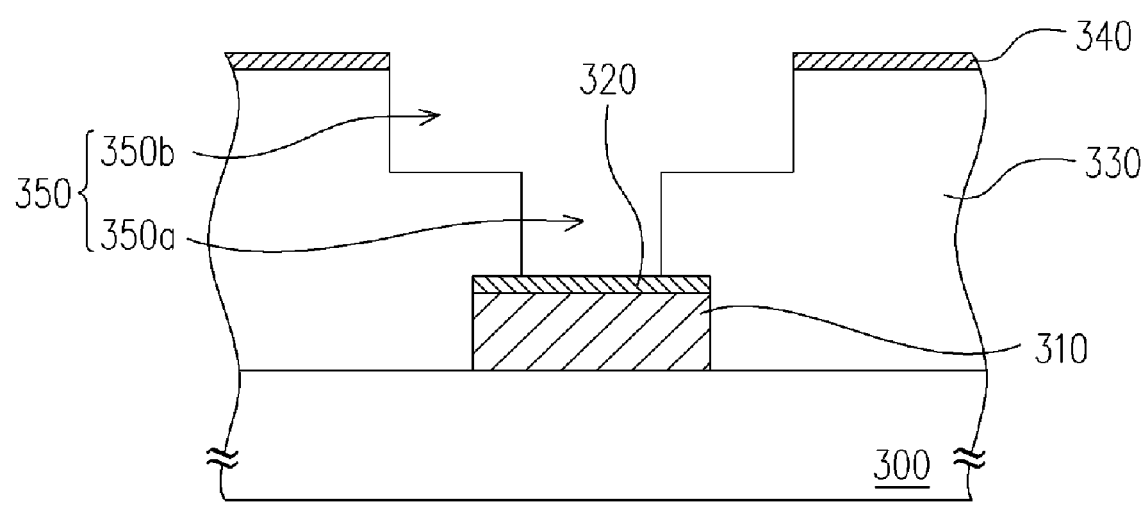
FIG. 3 is a schematic cross-sectional view showing the structure of a dual damascene opening in a method of removing the residues deposited after a plasma process according to another embodiment of the present invention.

To explain the present invention in greater detail, the method of fabricating a dual damascene opening is used as an example to show the application of the present invention. FIG. 2 is a flow diagram showing the steps for removing the residues deposited after a plasma process according to another embodiment of the present invention. FIG. 3 is a schematic cross-sectional view showing the structure of a dual damascene opening in a method of removing the residues deposited after a plasma process according to another embodiment of the present invention.

As shown in FIGS. 2 and 3, the method of removing the residues after a plasma process according to the present invention includes providing a substrate 300 having a conductive area 310 thereon (in step 210). Furthermore, a dielectric layer 330 and a mask layer 340 are sequentially disposed on the substrate 300 and cover the conductive area 310, for example. The mask layer 340 is fabricated using a metal-containing material, for example.

The substrate 300 has undergone a certain number of semiconductor fabrication processes to form all the required semiconductor devices (not shown) such as NMOS, PMOS and CMOS or memory devices such as ROM, SRAM and DRAM.

The conductive area 310 can be a source, a drain or a gate of the aforesaid device or the conductive area 310 can be the conductive line such as the copper conductive line of the aforesaid devices. The mask layer 340 is fabricated using a metal-containing material such as titanium, titanium nitride, tantalum nitride, titanium oxide or titanium-tungsten alloy, for example. The dielectric layer 330 is fabricated using a low-k dielectric material with a dielectric constant smaller than 4 by performing a chemical vapor deposition process or a spin-on process. The low-k dielectric material includes potassium fluoride, fluorinated amorphous carbon, carbon-doped oxide, parylene, AF4, PAE or cyclotene, for example.

In one embodiment, if the conductive area 310 is a conductive line, then an anti-reflection layer 320 can be selectively disposed between the conductive area 310 and the dielectric layer 330. The anti-reflection layer 320 is fabricated using a metal-containing compound such as titanium, titanium nitride, tantalum nitride, titanium oxide or titanium-tungsten alloy.

Then, using the mask layer 340 as a mask, a fluoride-containing plasma process is performed to form an opening 350 that exposes the conductive area 310 in the dielectric layer 330, and to produce some residues on the surface of the mask layer and the inner-surface of the opening (in step 220). The residues of the surface of the mask layer contain said metal, for example. The fluorine-containing gases used in the fluoride-containing plasma process for producing the plasma include $CF_4$, $C_2F_6$, $C_3F_8$, $C_4F_8$, $C_5F_8$ or $CFH_3$, for example. The residues are produced after the fluorine-containing plasma on the surface of the mask layer and the inner-surface of the opening. The residues can be the organic polymer compound formed by the reaction between the atoms used in the plasma process and the etched material. Alternatively, the residues can be the metal fluoride compound such as titanium fluoride or tantalum fluoride formed by the reaction between the fluorine atoms and the metal in the mask layer 340 or the anti-reflection layer 320.

The opening 350 formed in the dielectric layer 330 includes a plug opening 350a in the lower portion and a conductive line trench 350b in the upper portion. If the conductive area 310 is a source, drain or a gate, then the plug opening 350a in the lower portion of the opening 350 is a contact hole. If the conductive area 310 is a conductive line, then the plug opening 350a in the lower portion of the opening 350 is a via hole.

Thereafter, a dry cleaning operation is performed to remove a portion of the residues (in step 230). The dry cleaning operation uses hydrogen and nitrogen or hydrogen and helium as the plasma-producing gases. Through the dry cleaning operation, the molecular bonds in the organic polymer are broken so that most of the organic polymer compounds are removed.

In one embodiment, the metal fluoride residues are produced in step 230, for example. This is because if the rate of formation of the organic polymer is faster in the fluorine-containing plasma etching process, the organic polymer may cover the opening 350 and the surface of the mask layer 340 and isolate the mask layer 340 and the fluorine atoms. Hence, there will be no metallic fluoride compound in the residue. In step 230, because most of the organic polymer has been removed by the dry cleaning operation, the metal in the mask layer 340 or the anti-reflection layer 320 will react with the fluorine atoms in the plasma to form metal fluoride residues.

Thereafter, a wet cleaning operation is performed using a cleaning agent to remove the remaining residues (in step 240). The cleaning agent is a solution mixture containing water, diluted hydrofluoric acid and an acid solution, for example. Refer to the aforementioned description for the ingredients and ratios of the ingredients in the cleaning agent. In one embodiment, the cleaning agent contains diluted hydrofluoric acid at a concentration of about 800 ppm, sulfuric acid at a concentration of about 5% of the cleaning agent by weight and de-ionized water, for example. Since the cleaning agent contains diluted hydrofluoric acid and an acid solution, the metallic fluoride and the remaining organic polymer residues can be removed simultaneously to maintain the profile of the opening and prevent possible short circuit or current leak. In addition, because the cleaning agent has a limited capacity for etching copper conductive lines, the lost of copper in the conductive lines is quite limited. Hence, the conductivity capability among the device will be facilitated.

Although the present invention is illustrated using a dual damascene opening, the opening 350 can also be a contact opening or a via opening as well. In other words, the invention is not limited to the process of fabricating a dual damascene opening described in the present embodiment.

In summary, the cleaning agent and the method of removing the residues left after a plasma process can easily remove organic polymer and metal fluoride residues to maintain a constant device profile. The method not only increases the product yield, but also reduces the chance of having a current leak or a short circuit in the device.

Furthermore, the cleaning agent is cheap compared with the conventional solvent such as the ST250 so that the production cost can be significantly reduced. Moreover, the cleaning agent can easily remove metallic fluoride compounds. Hence, there is no need to remove fluorine-containing particles within a designated period (before forming the metal fluoride). One only has to perform a single wet cleaning operation after the etching process. Thus, the present invention can simplify the fabrication process as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of removing residue left after a plasma process, comprising the steps of:
   providing a substrate having at least a material layer formed thereon, wherein the material layer comprises a metal;
   performing a fluorine-containing plasma process thus a residue containing the metal is produced on the surface of the material layer, wherein the residue includes titanium fluoride or tantalum fluoride; and
   performing a wet cleaning operation using a cleaning agent to remove the residue, wherein the cleaning agent comprises water, diluted hydrofluoric acid and an acid solution.

2. The method of claim 1, wherein the diluted hydrofluoric acid in the cleaning agent has a concentration of greater than or equal to 30 ppm.

3. The method of claim 1, wherein the percentage by weight of the acid solution in the cleaning agent is greater than or equal to 1%, besides the acid solution includes an organic acid compound or an inorganic acid compound.

4. The method of claim 1, wherein the metal includes titanium or tantalum.

5. The method of claim 1, wherein the material layer includes titanium, titanium nitride, tantalum nitride or titanium-tungsten alloy.

6. The method of claim 1, further includes a conductive area and a low-k dielectric layer disposed from bottom to top between the material layer and the substrate.

7. The method of claim 6, wherein the low-k dielectric layer includes potassium fluoride, fluorinated amorphous carbon or carbon-doped oxide.

8. The method of claim 6, further includes performing the fluorine-containing plasma process using the material layer as a mask to form an opening to expose the conductive area in the low dielectric material layer.

9. The method of claim 8, wherein the opening includes a via hole, a contact hole or a dual damascene opening.

10. The method of claim 8, wherein after performing the fluorine-containing plasma process but before performing the wet cleaning operation, the method further includes performing a dry cleaning operation.

11. The method of claim 10, wherein the gases for forming the plasma in the dry cleaning operation includes hydrogen and nitrogen.

12. The method of claim 10, wherein the gases for forming the plasma in the dry cleaning operation includes hydrogen and helium.

13. The method of claim 1, further includes:
   a conductive area disposed between the substrate and the material layer; and
   a low-k dielectric layer disposed on the material layer and covers the substrate.

14. The method of claim 13, further includes performing the fluorine-containing plasma process using the material layer as an anti-reflection layer to form an opening to expose the material layer in the low dielectric material layer.

* * * * *